US010224949B1

(12) United States Patent
Li et al.

(10) Patent No.: US 10,224,949 B1
(45) Date of Patent: Mar. 5, 2019

(54) SHARED CYCLE LSB GENERATION FOR AN ARRAY OF SUCCESSIVE APPROXIMATION ANALOG-TO-DIGITAL CONVERTERS

(71) Applicant: SYNAPTICS INCORPORATED, San Jose, CA (US)

(72) Inventors: Zheming Li, San Jose, CA (US); Steve Chikin Lo, Sunnyvale, CA (US); Chunbo Liu, San Jose, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/046,187

(22) Filed: Jul. 26, 2018

(51) Int. Cl.

| | |
|---|---|
| ***H03M 1/38*** | (2006.01) |
| ***H03M 1/46*** | (2006.01) |
| *G06F 3/041* | (2006.01) |
| *G06F 3/044* | (2006.01) |

(52) U.S. Cl.
CPC ............... *H03M 1/46* (2013.01); *G06F 3/044* (2013.01); *G06F 3/0416* (2013.01)

(58) Field of Classification Search
CPC ......... H03M 1/46; G06F 3/044; G06F 3/0416
USPC ......................... 341/161, 145, 155, 156, 118
See application file for complete search history.

(56) References Cited

U.S. PATENT DOCUMENTS

| | | | | |
|---|---|---|---|---|
| 8,884,801 | B1 * | 11/2014 | Ranjbar | H03M 1/145 341/156 |
| 8,981,972 | B2 * | 3/2015 | Shen | H03M 1/38 341/118 |
| 9,143,156 | B1 * | 9/2015 | Aftab | H03M 1/68 |
| 9,319,059 | B1 * | 4/2016 | Sharma | H03M 1/38 |
| 9,331,706 | B1 * | 5/2016 | Ranjbar | H03M 1/145 |
| 9,489,618 | B2 * | 11/2016 | Roy | G11C 11/16 |
| 9,647,676 | B2 * | 5/2017 | Srinivasa | H03M 1/1245 |
| 2008/0258959 | A1 * | 10/2008 | Trifonov | H03M 1/145 341/156 |

* cited by examiner

*Primary Examiner* — Jean B Jeanglaude
(74) *Attorney, Agent, or Firm* — Patterson + Sheridan, LLP

(57) ABSTRACT

An example apparatus for converting a plurality of analog signals to a plurality of digital signals includes: a plurality of successive approximation (SAR) analog-to-digital converters (ADCs) each including a first input configured to receive a respective one of the plurality of analog signals, a second input configured to receive a reference signal, and an output configured to provide a respective one of the plurality of digital signals; and a shared cycle LSB generator coupled to the plurality of SAR ADCs and configured to provide the reference signal shared by the plurality of SAR ADCs.

24 Claims, 12 Drawing Sheets

SHARED CYCLE LSB GENERATION FOR AN ARRAY OF SUCCESSIVE APPROXIMATION ANALOG-TO-DIGITAL CONVERTERS

BACKGROUND

Field of the Disclosure

Embodiments of disclosure generally relate to electronic circuits and, more particularly, to shared cycle least significant bit (LSB) generation for an array of successive approximation (SAR) analog-to-digital converters (ADCs).

Description of the Related Art

The ability to digitize analog signals near the front-end of a receiver allows many traditional analog functions to be implemented in the digital domain. Example analog functions that can be implemented in the digital domain include filtering, demodulating, and the like. Moving such functions from the analog domain to the digital domain offers significant benefits in terms of implementation area, performance, power consumption. In addition, such a transition provides for system and operational flexibility (e.g., allows the functions to be firmware-defined, rather than hardware-defined). An analog-to-digital converter (ADC) is an important circuit to enable early digitizing in an analog front end (AFE). The ADC should be compact to conserve implementation area and efficient in terms of power consumption. The size and efficiency of an ADC is particularly important for devices that have multiple signal channels requiring multiple AFEs and multiple ADCs.

SUMMARY

In an embodiment, an apparatus for converting a plurality of analog signals to a plurality of digital signals includes: a plurality of successive approximation (SAR) analog-to-digital converters (ADCs) each including a first input configured to receive a respective one of the plurality of analog signals, a second input configured to receive a reference signal, and an output configured to provide a respective one of the plurality of digital signals; and a shared reference generator coupled to the plurality of SAR ADCs and configured to provide the reference signal shared by the plurality of SAR ADCs.

In another embodiment, an integrated circuit (IC) includes: a plurality of analog front ends (AFEs) configured to provide a plurality of analog signals; a plurality of successive approximation (SAR) analog-to-digital converters (ADCs) each including a first input configured to receive one of the plurality of analog signals, a second input configured to receive a reference signal, and an output configured to provide a digital signal; a shared reference generator coupled to the plurality of SAR ADCs and configured to provide the reference signal shared by the plurality of SAR ADCs; and a processing system configured to process the digital signal output from each of the plurality of SAR ADCs.

In another embodiment, a method of converting a plurality of analog signals to a plurality of digital signals includes: providing the plurality of analog signals to a plurality of successive approximation (SAR) analog-to-digital converters (ADCs) each including a first input configured to receive a respective one of the plurality of analog signals, a second input configured to receive a reference signal, and an output configured to provide a respective one of the plurality of digital signals; and generating the reference signal using a shared reference generator shared by the plurality of SAR ADCs.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only some embodiments of this disclosure and are therefore not to be considered limiting of its scope, for the disclosure may admit to other equally effective embodiments.

Figure 1:
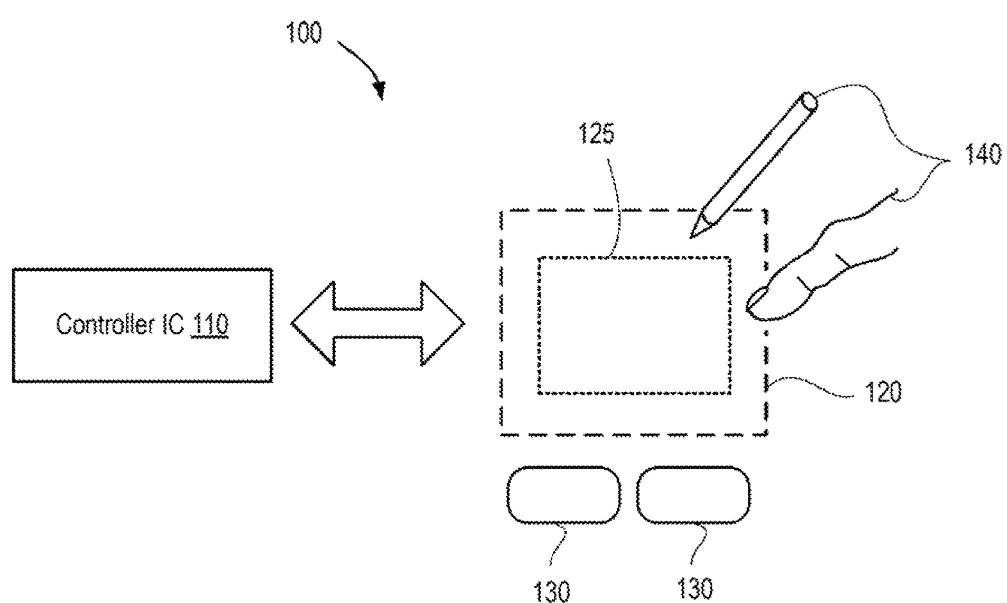
FIG. 1 is a block diagram of an exemplary input device, according to one embodiment described herein.

To facilitate understanding, identical reference numerals have been used, where possible, to designate identical elements that are common to the figures. It is contemplated that elements disclosed in one embodiment may be beneficially utilized on other embodiments without specific recitation. The drawings should not be understood as being drawn to scale unless specifically noted. Also, the drawings may be simplified and details or components omitted for clarity of presentation and explanation. The drawings and discussion serve to explain principles discussed below, where like designations denote like elements.

DETAILED DESCRIPTION

FIG. 1 is a block diagram of an exemplary input device 100, in accordance with embodiments of the disclosure. The input device 100 may be configured to provide input to an electronic system (not shown). As used in this document, the term “electronic system” (or “electronic device”) broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Example communication protocols include Inter-Integrated Circuit ($I^2C$), Serial Peripheral Interface (SPI), Personal System/2 (PS/2), Universal Serial Bus (USB), Bluetooth®, Radio Frequency (RF), and Infrared Data Association (IrDA) communication protocols.

In FIG. 1, the input device 100 is shown as a proximity sensor device (also often referred to as a "touchpad" or a "touch sensor device") configured to sense input provided by one or more input objects 140 in a sensing region 120 using sensor electrodes 125. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, in some embodiments, sensing input may comprise no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes 125 reside, by face sheets applied over the sensor electrodes 125 or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohm ically shorted together to form larger sensor electrodes 125. Some capacitive implementations utilize resistive sheets, which may be uniformly resistive.

Some capacitive implementations utilize "self-capacitance" (or "absolute capacitance") sensing methods based on changes in the capacitive coupling between sensor electrodes 125 and an input object. In various embodiments, an input object near the sensor electrodes 125 alters the electric field near the sensor electrodes 125, thus changing the measured capacitive coupling. In one implementation, an absolute capacitance sensing method operates by modulating sensor electrodes 125 with respect to a reference voltage (e.g. system ground), and by detecting the capacitive coupling between the sensor electrodes 125 and input objects.

Some capacitive implementations utilize "mutual capacitance" (or "transcapacitance") sensing methods based on changes in the capacitive coupling between sensor electrodes 125. In various embodiments, an input object near the sensor electrodes 125 alters the electric field between the sensor electrodes 125, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be electrically modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes 125 may be dedicated transmitters or receivers, or may be configured to both transmit and receive.

In FIG. 1, a controller integrated circuit (IC) 110 is shown as part of the input device 100. The controller IC 110 is configured to operate the hardware of the input device 100 to detect input in the sensing region 120. The controller IC 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the controller IC 110 also comprises electronically-readable instructions, such as firmware code, software code, and/or the like. In some embodiments, components composing the controller IC 110 are located together, such as near sensing element(s) of the input device 100. In other embodiments, components of controller IC 110 are physically separate with one or more components close to sensing element(s) of input device 100, and one or more components elsewhere. For example, the input device 100 may be a peripheral coupled to a desktop computer, and the controller IC 110 may comprise software configured to run on a central processing unit of the desktop computer and one or more ICs (perhaps with associated firmware) separate from the central processing unit. As another example, the input device 100 may be physically integrated in a phone, and the controller IC 110 may comprise circuits and firmware that are part of a main processor of the phone. In some embodiments, the controller IC 110 is dedicated to implementing the input device 100. In other embodiments, the controller IC 110 also performs other functions, such as operating display screens, driving haptic actuators, etc.

The controller IC 110 may be implemented as a set of modules that handle different functions of the controller IC 110. Each module may comprise circuitry that is a part of the controller IC 110, firmware, software, or a combination thereof. In various embodiments, different combinations of modules may be used. Example modules include hardware operation modules for operating hardware such as sensor electrodes 125 and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the controller IC 110 responds to user input (or lack of user input) in the sensing region 120 directly by causing one or more actions. Example actions include changing operation modes, as well as graphical user interface (GUI) actions such as cursor movement, selection, menu navigation, and other functions. In some embodiments, the controller IC 110 provides information about the input (or lack of input) to some part of the electronic system (e.g. to a central processing system of the electronic system that is separate from the controller IC 110, if such a separate central processing system exists). In some embodiments, some part of the electronic system processes information received from the controller IC 110 to act on user input, such as to facilitate a full range of actions, including mode changing actions and GUI actions.

For example, in some embodiments, the controller IC 110 operates the sensing element(s) of the input device 100 to produce electrical signals indicative of input (or lack of input) in the sensing region 120. The controller IC 110 may perform any appropriate amount of processing on the electrical signals in producing the information provided to the electronic system. For example, the controller IC 110 may digitize analog electrical signals obtained from the sensor electrodes 125. As another example, the controller IC 110 may perform filtering or other signal conditioning. As yet another example, the controller IC 110 may subtract or otherwise account for a baseline, such that the information reflects a difference between the electrical signals and the baseline. As yet further examples, the controller IC 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the controller IC 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes 125 overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the controller IC 110.

It should be understood that while many embodiments of the disclosure are described in the context of a fully functioning apparatus, the mechanisms of the present disclosure are capable of being distributed as a program product (e.g., software) in a variety of forms. For example, the mechanisms of the present disclosure may be implemented and distributed as a software program on information bearing media that are readable by electronic processors (e.g., non-transitory computer-readable and/or recordable/writable information bearing media readable by the controller IC 110). Additionally, the embodiments of the present disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
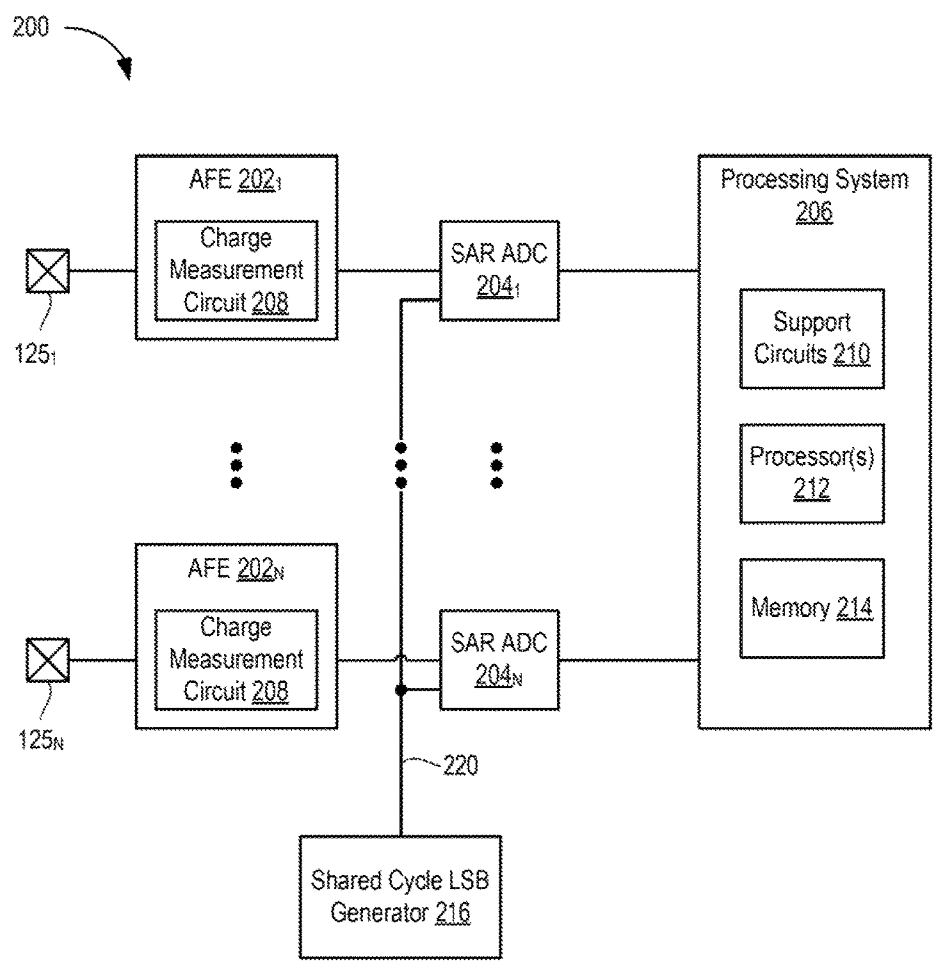
FIG. 2 is a block diagram depicting circuitry in a controller integrated circuit (IC) according to an embodiment.

FIG. 2 is a block diagram depicting circuitry 200 in the controller IC 110 according to an embodiment. The circuitry 200 includes analog front-ends (AFEs) $\mathbf{202}_1$ through $\mathbf{202}_N$, successive approximation (SAR) analog-to-digital converters (ADCs) $\mathbf{204}_1$ through $\mathbf{204}_N$, and a processing system 206. In FIG. 2, N is an integer greater than one. The SAR ADCs $\mathbf{204}_1 \ldots \mathbf{204}_N$ are collectively referred to as a SAR ADC array 204. Each of the AFEs $\mathbf{202}_1 \ldots \mathbf{202}_N$ includes a charge measurement circuit 208. Each of the AFEs $\mathbf{202}_1 \ldots \mathbf{202}_N$ includes an input coupled to a respective sensor electrode $\mathbf{125}_1 \ldots \mathbf{125}_N$. Each of the AFEs $\mathbf{202}_1 \ldots \mathbf{202}_N$ includes an output coupled to an input of a respective SAR ADC $204_1$ . . . $204_N$. Outputs of the SAR ADCs $204_1$ . . . $204_N$ are coupled to inputs of the processing system 206. The processing system 206 includes one or more processors ("processor(s) 212"), support circuits 210, and memory circuits ("memory 214"). The circuitry 200 includes a shared cycle LSB generator 216 having an output 220. The output 220 of the shared cycle LSB generator 216 is coupled to an input of each of the SAR ADCs $204_1$ . . . $204_N$.

In operation, the AFEs $202_1$ . . . $202_N$ generate a plurality of analog signals as output. In particular, the charge measurement circuit 208 in each of the AFEs $202_1$ . . . $202_N$ measures charge on a respective sensor electrode 125 and generates an analog signal indicative of the measured charge. The charge measurement circuit 208 can be a charge integrator, current conveyor, or the like. The SAR ADCs $204_1$ . . . $204_N$ sample the respective analog signals output from the AFEs $202_1$ . . . $202_N$. Each of the SAR ADCs $204_1$ . . . $204_N$ generates digital codes from input samples using a successive approximation technique. The SAR ADCs $204_1$ . . . $204_N$ output digital signals each providing a sequence of digital codes. The processing system 206 receives the digital signals output from the SAR ADCs $204_1$ . . . $204_N$. The processor(s) 212 perform various functions on the digital signals, such as filtering, demodulation, and the like. The processor(s) 212 can include digital signal processor(s) (DSP(s)), microprocessor(s), microcontroller(s), or the like. Some of the processor(s) 212 can execute code stored in memory 214 (e.g., firmware) to perform various functions. The support circuits 210 can include power supplies, busses, input/output interfaces, and the like to support operation of the processor(s) 212.

In the successive approximation technique, each SAR ADC $204_i$ (i=1, 2, . . . , N) converts an input sample to a digital code using a binary search algorithm over a plurality of SAR cycles. In an embodiment, the SAR ADC $204_i$ resolves one-bit of a given digital code per SAR cycle (e.g., there are K SAR cycles for a K-bit digital code). For each input sample, the SAR ADC $204_i$ resolves bits of the digital code from the most significant bit (MSB) to the least significant bit (LSB). The SAR ADC $204_i$ resolves a given bit of the digital code by performing a comparison between an input sample and a reference level. The SAR ADC $204_i$ adjusts either the input sample or the reference level from one SAR cycle to the next depending on the particular bit of the digital code being resolved and the result of the previous comparison.

For example, in an embodiment, the SAR ADC $204_i$ successively compares a voltage of the input sample ($V_{IN}$) with a reference voltage $V_{REF,i}[k]$, where k=1, 2, . . . , L for a L-bit digital code. The reference voltage for the $(k+1)^{st}$ SAR cycle ($V_{REF,i}[k+1]$) is generated by adding or subtracting a fixed voltage associated with the $(k+1)^{st}$ bit of the digital code being resolved. Thus, $V_{REF,i}[k+1]=V_{REF,i}[k] \pm LSB[k+1]$, where $LSB[k+1]=V_{FS}/2^{k+1}$ and $V_{FS}$ is the full-scale voltage of the SAR ADC $204_i$. Whether the LSB voltage is added or subtracted depends on the comparison result of the kth SAR cycle. In the SAR ADC array 204, because the input to each SAR ADC is different, the comparison result sequence generated by each SAR ADC $204_1$ . . . $204_N$ is different. As such, in general, the reference voltage $V_{REF,i}[k]$ is different for each SAR ADC $204_1$ . . . $204_N$ across the SAR cycles. However, during each SAR cycle, each SAR ADC $204_1$ . . . $204_N$ adds or subtracts the same LSB voltage (e.g., LSB[k+1]) to or from the reference voltage $V_{REF,i}[k]$. Thus, in an embodiment, a single cycle LSB generator 216 shared by all ADCs in the array will generate the cycle LSB voltage LSB[k] during each SAR cycle, and SAR ADC $204_1$ . . . $204_N$ will take this LSB[k] as input and add or subtract the LSB[k] to their respective $V_{REF,i}[k]$ to generate their k+1 cycle reference $V_{REF,i}[k+1]$. In a SAR ADC, the largest portion of the resources, either in silicon area or in time, is often devoted to obtaining the L-bit precision of the reference $V_{REF,i}[k]$, or, equivalently, the cycle LSB LSB[k]. By centralizing and sharing the cycle LSB generation, the SAR ADC array 204 requires only one single instance of the shared high-precision cycle LSB generator 216, and thus significantly reduces the circuit complexity and silicon area of the circuitry 200. Various embodiments of the SAR ADC $204_i$ topologies that implements such shared cycle LSB generation architecture are described below.

Figure 3:
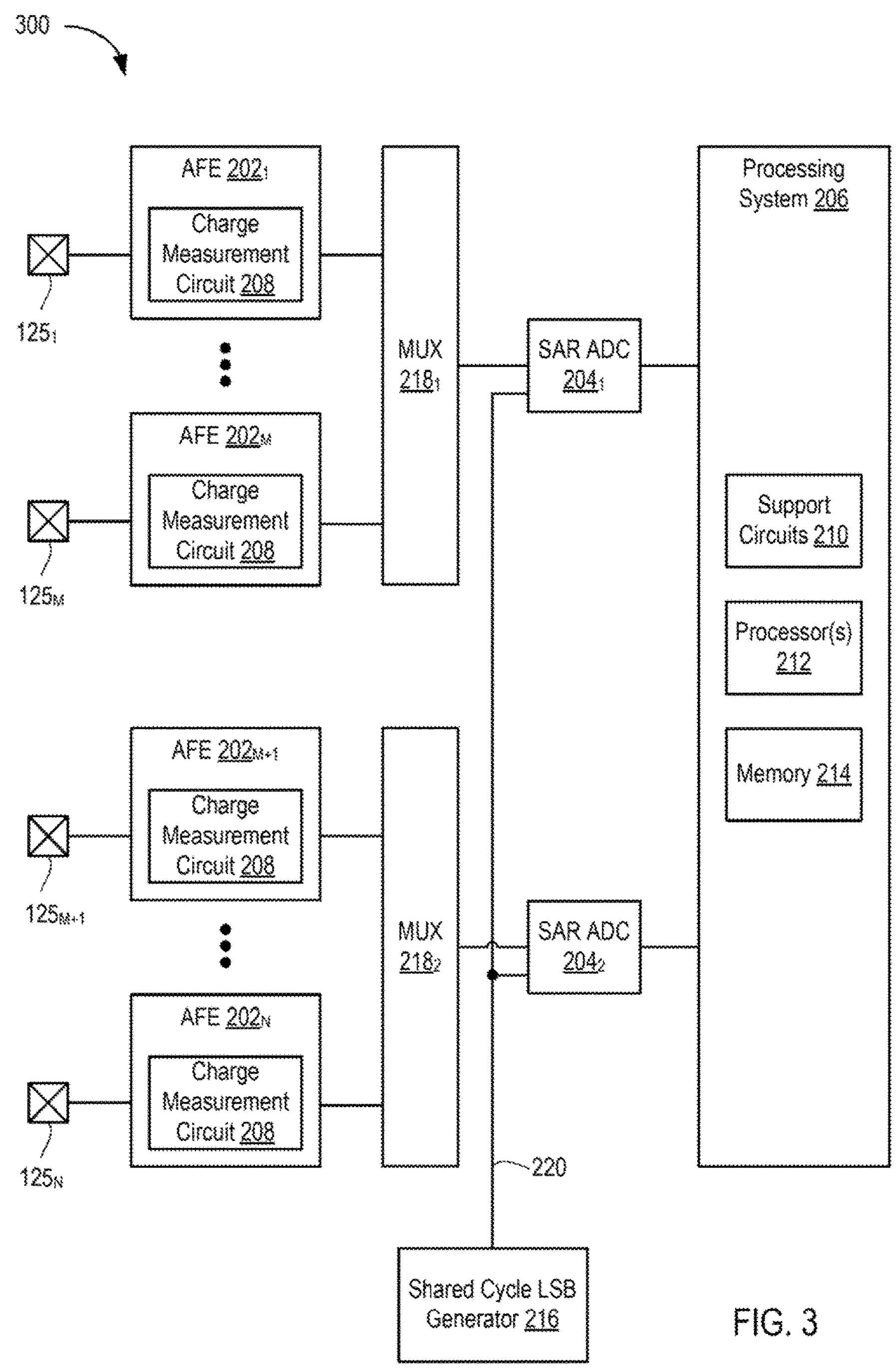
FIG. 3 is a block diagram depicting circuitry in a controller IC 100 according to an embodiment.

FIG. 3 is a block diagram depicting circuitry 300 in the controller IC 110 according to an embodiment. Elements in FIG. 3 that are the same or similar as those in FIG. 2 are designated with identical reference numerals and are described in detail above. In the present embodiment, the SAR ADC array 204 includes less than N SAR ADCs, e.g., SAR ADC $204_1$ and SAR ADC $204_2$. The inputs of the SAR ADCs $204_1$ and $204_2$ are multiplexed among sets of the AFEs $202_1$ . . . $202_N$. In the example, the circuitry includes a multiplexer (MUX) $218_1$ and a MUX $218_2$. An output of the MUX $218_1$ is coupled to an input of the SAR ADC $204_1$. An output of the MUX $218_2$ is coupled to an input of the SAR ADC $204_2$. Inputs of the MUX $218_1$ are coupled to outputs of the AFEs $202_1$ . . . $202_M$, where M is an integer less than N. Inputs of the MUX $218_2$ are coupled to outputs of the AFEs $202_{M+1}$ . . . $202_N$. Thus, the analog input signal to each SAR ADC $204_1$ can be selected from a plurality of analog output signals of a respective plurality of AFEs $202_1$ . . . $202_N$. The circuitry can include more than two multiplexers 218 and more than two SAR ADCs in the SAR ADC array 204. Otherwise, the SAR ADC array 204 operates as described above FIG. 4 is a block diagram depicting a SAR ADC $204_i$ according to an embodiment. While the SAR ADC $204_i$ is described in the context of a capacitive sensing device as shown in FIGS. 1-3, it is to be understood that the SAR ADC $204_i$ can be used in any of a myriad of other applications and is not specific to use in a capacitive sensing device.

The SAR ADC $204_i$ includes a reference input circuit 402, a sample-and-hold circuit 404, a comparator 406, and SAR logic 410. An input of the reference input circuit 402 is coupled to the output 220 of the shared cycle LSB generator 216. The sample-and-hold circuit 404 includes a switch 408 and a capacitor $C_{SH}$. The switch 408 is coupled between nodes 412 and 418. The node 412 is coupled to receive the analog input signal (e.g., either directly from an AFE as in FIG. 2 or indirectly from an AFE through a multiplexer as in FIG. 3). The capacitor $C_{SH}$ is coupled between the node 418 and constant bias voltage (e.g., electrical ground or some other constant voltage, such as a mid-range voltage). The node 418 is further coupled to an output of the reference input circuit 402 and a non-inverting input of the comparator 406. A fixed reference voltage (i.e., constant reference voltage) $V_{REF,FIX}$ is coupled to an inverting input of the comparator 406. An output of the comparator 406 (designated $D_{OUT}$) is coupled to an input of the SAR logic 410. An output of the SAR logic 410 (designated CTRL) is coupled to another input of the reference input circuit 402. Another output of the SAR logic 410 is coupled to a node 416, which supplies a digital output signal.

In operation, the SAR ADC 204; samples the analog input signal by closing and then opening the switch 408, which charges the capacitor $C_{SH}$ to generate an input voltage $V_{IN}$. The comparator 406 compares the input voltage $V_{IN}$ with the fixed reference voltage $V_{REF,FIX}$. For example, the comparator 406 generates a logic "1" voltage when $V_{IN}$ is greater than $V_{REF,FIX}$, and a logic "0" voltage when $V_{IN}$ is less than $V_{REF,FIX}$. The comparator 406 always makes a decision, even in the case where $V_{IN}$ is equal to or approximately equal to $V_{REF,FIX}$. The SAR logic 410 receives the signal $D_{OUT}$ from the comparator 406. The SAR logic 410 controls the reference input circuit 402 using a J-bit control signal, where J is an integer greater than zero. The width of the CTRL signal depends on the number of switches in the reference input circuit 402. Embodiments of the reference input circuit 402 are discussed below. The SAR logic 410 generates an L-bit digital code for each input sample. The SAR logic 410 controls the reference input circuit 402 using the CTRL signal to implement a SAR technique to resolve bits of the L-bit digital code.

In the embodiment, the SAR logic 410 controls the reference input circuit 402 to adjust $V_{IN}$ for different SAR cycles. The voltage at the inverting input of the comparator 406 remains fixed at $V_{REF,FIX}$. In general, the comparator 406 compares the kth cycle $V_{IN}=V_{IN}[k]$ with $V_{FS}/2$ for k=1, 2, . . . , L SAR cycles. The SAR logic 410 controls the reference input circuit 402 to update $V_{IN}$ after each comparison as follows: $V_{IN}[k+1]=V_{IN}[k]\pm V_{LSB}[k+1]$ for k=1, 2, . . . , K−1 and $V_{IN}[1]$ is the initial voltage across the capacitor $C_{SH}$ after sampling the analog input signal. The reference input circuit 402 either directly or indirectly generates $V_{LSB}$ from the cycle LSB signal, depending on the nature of the cycle LSB signal (e.g., the reference signal can be a voltage signal, a current signal, or a charge signal). The voltage $V_{LSB}$ sequences through L−1 discrete voltages, i.e., $V_{FS}/2^2$, $V_{FS}/2^3$, . . . , $V_{FS}/2^L$. After the kth comparison, the SAR logic 410 controls the reference input circuit 402 to subtract $V_{SB}$ from $V_{IN}$ if the comparator 406 generates a logic "1" (i.e., $V_{IN}>V_{FS}/2$), and add $V_{LSB}$ to $V_{IN}$ if the comparator 406 generates a logic "0" (i.e., $V_{IN}<V_{FS}/2$). In this manner, the SAR ADC 204$_i$ successively resolves each bit of the digital code for a given input sample.

The reference input circuit 402 can include various structures depending on the nature of the cycle LSB signal. The cycle LSB signal can be a voltage signal, a current signal, or a charge signal. That is, the shared cycle LSB generator 216 can be a voltage source, current source, or charge source in different embodiments. Embodiments of the reference input circuit 402 and the shared cycle LSB generator 216 are described below.

Figure 4:
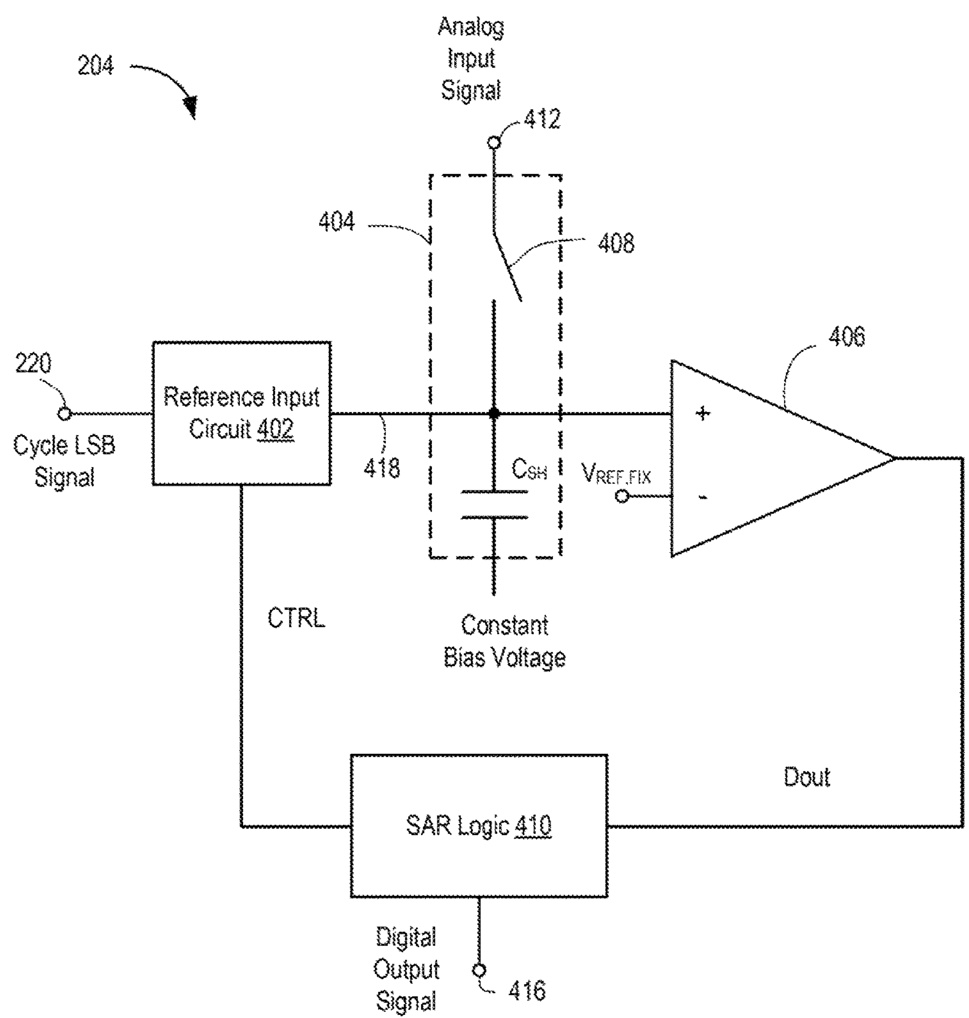
FIG. 4 is a block diagram depicting a successive approximation (SAR) analog-to-digital converter (ADC) according to an embodiment.

In the embodiment of FIG. 4, the SAR ADC 204$_i$ adjusts $V_{IN}$ at the non-inverting terminal of the comparator 406 from one SAR cycle to the next. In another embodiment, the SAR ADC 204$_i$ can instead adjust the reference voltage at the inverting terminal of the comparator 406. That is, the reference input circuit 402 can be coupled to the inverting terminal of the comparator 406 instead of the non-inverting terminal of the comparator 406. In such case, the reference input circuit 402 can include a capacitor for storing a voltage applied to the non-inverting terminal of the comparator 406 as a reference. The reference input circuit 402 then adjusts the reference voltage using the reference signal based on the control signal from the SAR logic 410.

Figure 9:
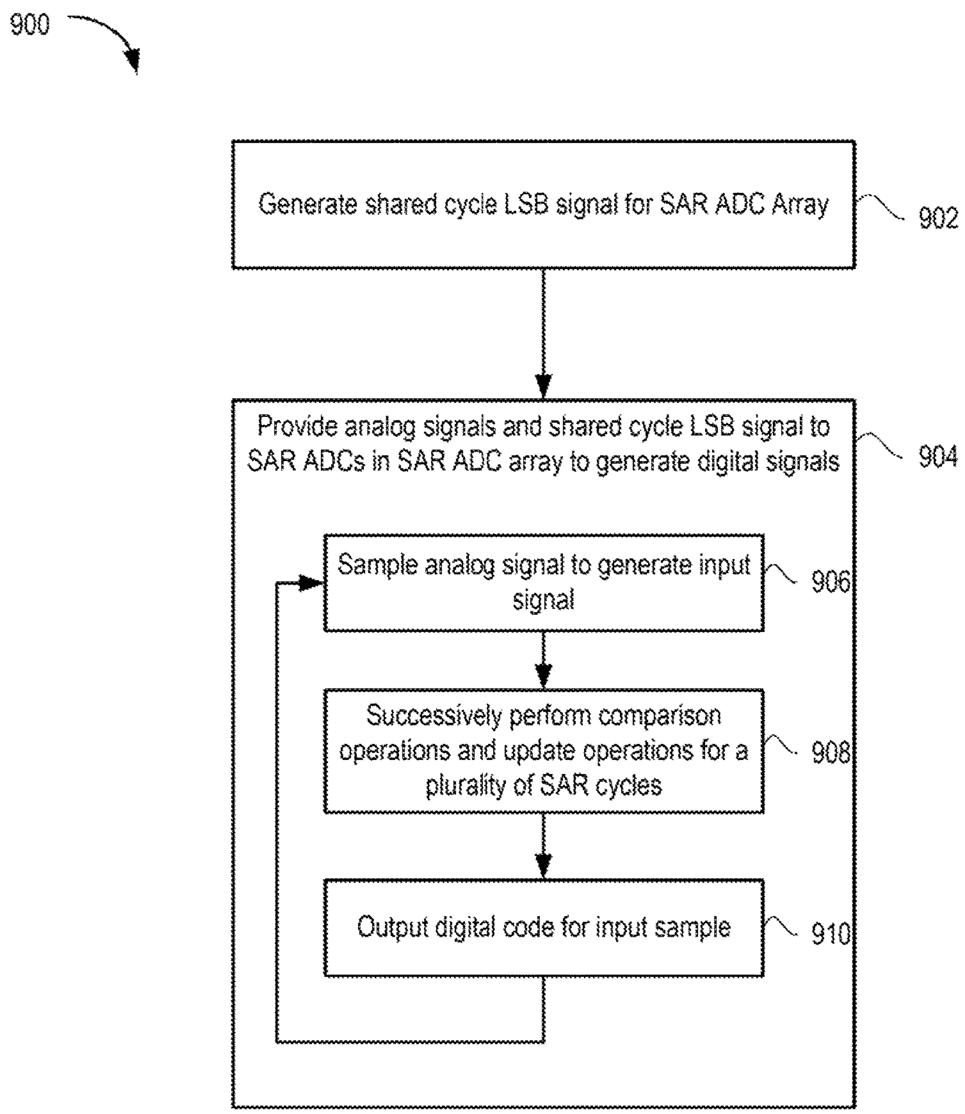
FIG. 9 is a flow diagram depicting a method of converting analog signals into digital signals using a SAR ADC array according to an embodiment.

FIG. 9 is a flow diagram depicting a method 900 of converting analog signals into digital signals using a SAR ADC array according to an embodiment. The method 900 includes blocks 902 and 904 that are concurrently performed in hardware using the circuitry discussed above. At block 902, the shared cycle LSB generator 216 generates the common cycle LSB signal for all ADCs the SAR ADC array 204. At block 904, the SAR ADC array 204 receives analog signals from the AFEs 202$_1$ . . . 202$_N$, and a single cycle LSB signal from the shared cycle LSB generator 216, and generates digital signals corresponding to the analog signals.

The block 904 includes sub-blocks 906, 908, and 910, which are performed repeatedly to generate a digital code for each input sample. At block 906, the SAR ADC 204$_i$ samples an analog signal to generate an input signal. At block 908, the SAR ADC 204$_i$ successively performs comparison operations and update operations for a plurality of SAR cycles. At block 910, the SAR ADC 204$_i$ outputs a digital code for the input sample.

The block 908 can be understood with respect to the following pseudocode description of the algorithm performed by the circuitry in the SAR ADC 204$_i$ for L SAR cycles, where L is the number of bits in the digital code.

```
int result;
int digital_code=0;
double V_IN=sampled analog input;
double V_FS=full-scale voltage of SAR ADC;
double V_LSB[L-1]={V_FS/4, V_FS/8, . . . , V_FS/2^L};
for (k=1; k≤L; k++) {
  // comparison operation
  result=compare (V_IN, V_FS/2); // result is 0 or 1
  digital_code=digital_code+result*2^(L-k);
  // update operation
  if (k<L && result==0) {
    // V_IN>V_FS/2
    V_IN=V_IN-V_LSB[k];
  }
  else if (k<L && result==1 {
    // V_IN<V_FS/2
    V_IN=V_IN+V_LSB[k];
  }
}
```

In the above example algorithm for the block 908, the input voltage $V_{IN}$ to the comparator 406 is updated after each SAR cycle (with the exception of the last SAR cycle). In another embodiment, the SAR ADC 204$_i$ can achieve the same functionality by keeping the input voltage $V_{IN}$ fixed and adjusting the inverting input of the comparator 406 (referred to as $V_{IN\_REF}$). The following is a pseudocode description of an alternative algorithm performed by the circuitry in the SAR ADC 204$_i$ for K SAR cycles, where K is the number of bits in the digital code:

```
int result;
int digital_code=0;
double V_IN=sampled analog input;
double V_FS=full-scale voltage of SAR ADC;
double V_IN_REF=V_FS/2;
double V_LSB[L-1]={V_FS/4, V_FS/8, . . . , V_FS/2^L};
for (k=1; k≤L; k++) {
  // comparison operation
  result=compare (V_IN, V_IN_REF); // result is 0 or 1
  digital_code=digital_code+result*2^(L-k);
  // update operation
  if (k<L && result==0) {
    // V_IN>V_IN_REF
    V_IN_REF=V_IN_REF+V_LSB[k];
  }
  else if (k<L && result==1 {
    // V_IN<V_IN_REF
    V_IN_REF=V_IN_REF-V_LSB [k];
  }
}
```

In the example pseudocode algorithms above, the function compare( ) is performed by the comparator 406. The sampled analog input is generated by the sample-and-hold circuit 404. The voltage $V_{IN\_REF}$ is effectively generated by the reference input circuit 402 based on the cycle LSB signal $V_{LSB}[k]$ generated by the shared cycle LSB generator 216. As described above, the cycle LSB signal can be a voltage signal, current signal, or charge signal.

Figure 5:
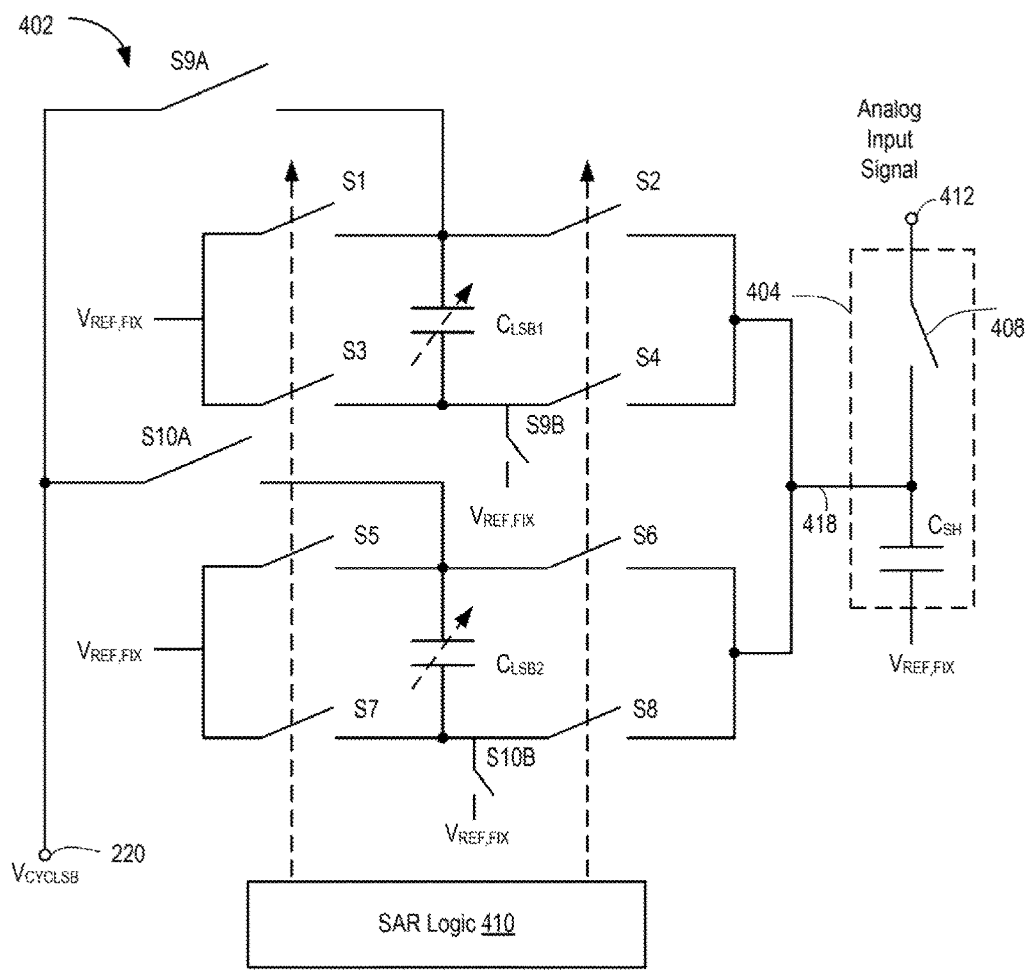
FIG. 5 is a schematic diagram depicting a reference input circuit in a SAR ADC according to an embodiment.

FIG. 5 is a schematic diagram depicting the reference input circuit 402 according to an embodiment. In the embodiment, the cycle LSB input at node 220 is a voltage signal $Vcyc_{LSB}$. The reference input circuit 402 includes a switched-capacitor circuit. In the embodiment, the reference input circuit 402 is coupled between the output 220 of the shared cycle LSB generator 216 and the node 418. As shown in FIG. 4, the node 418 is coupled to the capacitor $C_{SH}$ of the sample-and-hold circuit 404 and the non-inverting input of the comparator 406. The reference input circuit 402 includes variable capacitors $C_{LSB1}$ and $C_{LSB2}$ and switches S1 through S9A, S9B, S10A, and S10B. The SAR logic 410 generates 10 CTRL signals for controlling switches S1 . . . S10B. The switch S1 is coupled between a fixed reference voltage ($V_{REF,FIX}$) and a first terminal of the capacitor $C_{LSB1}$. The switch S2 is coupled between the first terminal of the capacitor $C_{LSB1}$ and the node 418. The switch S3 is coupled between the fixed reference voltage ($V_{REF,FIX}$) and a second terminal of the capacitor $C_{LSB1}$. The switch S4 is coupled between the second terminal of the capacitor $C_{LSB1}$ and the node 418. The switch S5 is coupled between the fixed reference voltage ($V_{REF,FIX}$) and a first terminal of the capacitor $C_{LSB2}$. The switch S6 is coupled between the first terminal of the capacitor $C_{LSB2}$ and the node 418. The switch S7 is coupled between the fixed reference voltage ($V_{REF,FIX}$) and a second terminal of the capacitor $C_{LSB2}$. The switch S8 is coupled between the second terminal of the capacitor $C_{LSB2}$ and the node 418. The switch S9A is coupled between the node 220 and the first terminal of the capacitor $C_{LSB1}$. The switch S10A is coupled between the node 220 and the first terminal of the capacitor $C_{LSB2}$. The switch S9B is coupled between the node 418 and the fixed reference voltage ($V_{REF,FIX}$). The switch 10B is coupled between the node 418 and the fixed reference voltage ($V_{REF,FIX}$). The node 220 supplies the reference signal. Each of the variable capacitors $C_{LSB1}$ and $C_{LSB2}$ is implemented as an array of switched capacitors.

In operation, the cycle LSB signal outputted by the shared cycle LSB generator 216 charges the capacitors $C_{LSB1}$ and $C_{LSB2}$ depending on the state of the switches S9A, S9B, S10A and S10B. During each SAR cycle, one of the $C_{LSB}$ capacitors is connected to the output 220 of the cycle LSB generator 216, and is charged to the $V_{CYCLSB}$ for the next SAR cycle. At the same time, the other $C_{LSB}$ capacitor is connected between $C_{SH}$ at node 418 and the mid-rail. In an example, in SAR cycles 1, 3, 5, . . . , a top plate of $C_{LSB1}$ is connected to node 220 via switch S9A, while a bottom plate of $C_{LSB2}$ is connected between $C_{SH}$ at node 418 and the mid-rail via switch S10B. Similarly, in SAR cycles 2, 4, 6, . . . , a top plate of $C_{LSB2}$ is connected to node 220 via the switch S10A, while a bottom plate of $C_{LSB1}$ is connected between $C_{SH}$ at node 418 and the mid-rail via the switch S9B. By executing the cycle LSB voltage transfer operation and SAR comparison operation in parallel, the time required for each SAR cycle is minimized and higher ADC conversion rate is achieved.

Referring to FIGS. 4-5, each SAR ADC 204 will resolve L-bits in L comparison cycles (i.e., the SAR cycle efficiency is 1-bit per cycle). Each SAR ADC 204 accomplishes the conversion of the input signal using a scaled successive approximation algorithm. The scaled successive approximation algorithm can be described by the equation:

$$V[k]=\alpha[k](V[k-1]-D[k-1]\cdot \mathrm{LSB}[k])$$

where V[k] is the voltage of the top plate of $C_{SH}$ coupled to the non-inverting input of the comparator 406 in cycle k, D[k] is the digital output of the comparator 406 in cycle k, LSB[k] is the LSB voltage for the kth cycle, and α[k] is the scale factor for the kth cycle. As a comparison, the conventional successive approximation algorithm, which is expressed by equation $V[k]=V[k-1]-D[k-1]\cdot LSB[k]$, is not scaled by the value α[k]. The inclusion of the factor α[k] in the scaled successive approximation algorithm allows for the realization of the subtraction of the LSB term in the equation using only a charge sharing between two capacitors, and thus allows the realization of the SAR ADC 204 using only capacitors and a comparator.

In an embodiment, each SAR ADC 204 implements the scaled successive approximation algorithm as follows. The top plate of $C_{SH}$ is pre-charged to input voltage $V_{IN}$ before the comparison cycles begin. The bottom plate of $C_{SH}$ is always connected to a constant bias voltage (e.g., mid-rail in the example). During the first comparison cycle, the top plate of $C_{SH}$ is connected to the non-inverting terminal of the comparator 406 and is compared. Further, one of the reference capacitor $C_{LSB1}$ or $C_{LSB2}$ is connected to the shared cycle LSB generator 216 and is being charged to $V_{LSB}^{buff}[2]$. During the kth comparison cycle (k between 2 and N inclusive), the reference capacitor that had been connected to the shared cycle LSB generator 216 during the (k−1)th cycle is connected to the capacitor $C_{SH}$. If the comparison result from the previous cycle was “1”, the top plate of this reference capacitor is connected to $C_{SH}$, and the bottom plate is connected to the fixed reference voltage $V_{REF,FIX}$. Alternatively, if the comparison result is “0”, the bottom plate of the reference capacitor is connected to $C_{SH}$ while the top plate is connected to the fixed reference voltage $V_{REF,FIX}$.

According to the above operation, the voltage at the non-inverting input of the comparator 406 is:

$$V[k]=\frac{C_{SH}}{C_{SH}+C_{LSB}[k]}\left(V[k]+(-D[k])\cdot V_{CYCLSB}[k]\cdot\frac{C_{LSB}[k]}{C_{SH}}\right)$$

This is the scaled successive approximation equation with $\alpha[k]=C_{SH}/(C_{SH}+C_{LSB}[k])$ and $LSB[k]=V_{CYCLSB}[k]*(C_{LSB}[k]/C_{SH})$, where $V_{CYCLSB}[k]$ is the output of the shared cycle LSB generator 216 during the (k−1)th comparison cycle. In an example, a latch in the comparator 406 can be stroked few tens of nanoseconds before the end of the comparison cycle.

With the scaled successive approximation equation, it can be shown that $|V[k]|\leq\alpha[k]\alpha[k-1]\ldots\alpha[2]V_{FS}/2^k$, where $V_{FS}$ is the full-scale voltage of the ADC array. Because the resolution of comparator 406 can be expensive in terms of silicon area and power consumption, it is desirable to select α[k] to be as large as possible. Since $\alpha[k]=C_{SH}/(C_{SH}+C_{LSB}[k])$, it is therefore desirable to select $C_{LSB}[k]$ to be as small as possible. On the other hand, in order for the successive approximation to result in a correct binary weighted digital representation of $V_{IN}$, it is required that $LSB[k]=V_{CYCLSB}[k]*(C_{LSB}[k]/C_{SH})=\alpha[k]\alpha[k-1]\ldots\alpha[2]V_{FS}/2^k$. Since LSB[k] is bounded by the ADC's full-scale voltage $V_{FS}$, $C_{LSB}[k]$ should be sufficiently large such that $(C_{SH}/C_{LSB}[k])\alpha[k]\alpha[k-1]\ldots\alpha[2]V_{FS}/2^k=V_{LSB,k}^{Buff}\leq V_{FS}$ is satisfied.

In an embodiment, in order to satisfy the above-described contradictory requirements while attaining optimal performance, the capacitance of the reference capacitors $C_{LSB1}$ and $C_{LSB2}$ is varied from comparison cycle to comparison cycle. That is, the capacitors $C_{LSB1}$ and $C_{LSB2}$ can be variable capacitors in an embodiment. In an embodiment, an optimal design is to use sufficiently large $C_{LSB}[k]$ for the first two or three cycles, then let $C_{LSB}[k]$ assume a minimum size allowed by matching consideration. This technique can be used to keep the required capacitor resolution to no more than one bit above the desired ADC array resolution.

Figure 6:
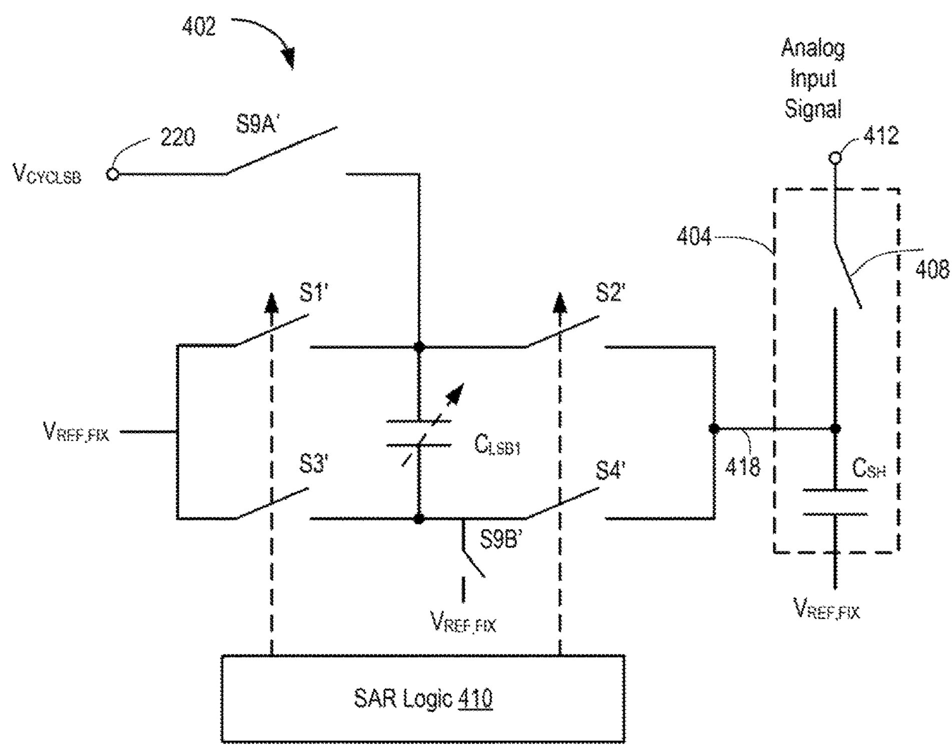
FIG. 6 is a schematic diagram depicting a reference input circuit in SAR ADC according to another embodiment.

FIG. 6 is a schematic diagram depicting the reference input circuit 402 according to another embodiment. The reference input circuit 402 includes a switched-capacitor circuit. In the embodiment of FIG. 6, the reference input circuit 402 includes only one capacitor $C_{LSB1}$ and the switches S1 . . . S4 and S9A, S9B. The reference capacitor $C_{LSB2}$ and the switches S5 . . . S8 and S10A, S10B are omitted. In this embodiment, the reference capacitor charging and the comparison operations are done in sequence, rather than in parallel as described above in FIG. 5. The embodiment of FIG. 6 requires less implementation area than the embodiment of FIG. 5 and can be used where the silicon area is required to be minimized at the cost of decreasing the maximum sampling rate. Otherwise, the reference input circuit 402 operates as described above with respect to FIG. 5. In an embodiment, the capacitor $C_{LSB1}$ can be a variable capacitor.

Figure 7:
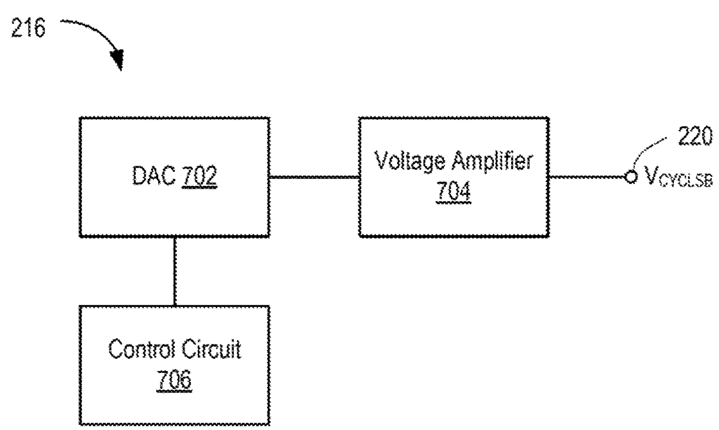
FIG. 7 is a block diagram depicting a shared reference generator for an array of SAR ADCs according to an embodiment.

FIG. 7 is a block diagram depicting the shared cycle LSB generator 216 according to an embodiment. The shared cycle LSB generator 216 includes a digital-to-analog converter (DAC) 702, a voltage amplifier 704, and a control circuit 706. The DAC 702 can be a segmented capacitor array DAC. The control circuit 706 provides a sequence of digital codes to the DAC 702, which generates a sequence of output voltages. The voltage amplifier 704 buffers the output voltage of the DAC 702 to provide the voltage $V_{CYCLSB}$. The voltage amplifier 704 can have unity gain or some other gain depending on the output voltage level of the DAC 702. In any case, the voltage $V_{CYCLSB}$ sequences through the a plurality of discrete values, e.g., $V_{REF,FIX}^{2}$, $V_{REF,FIX}^{3}$, . . . , $V_{REF,FIX}^{K}$ in the embodiment of FIG. 4 above. In another embodiment, the voltage amplifier 704 can be replaced by an electrical charge generating circuit configured to provide the cycle LSB signal as an electrical charge shared by the plurality of ADCs.

Figure 8:
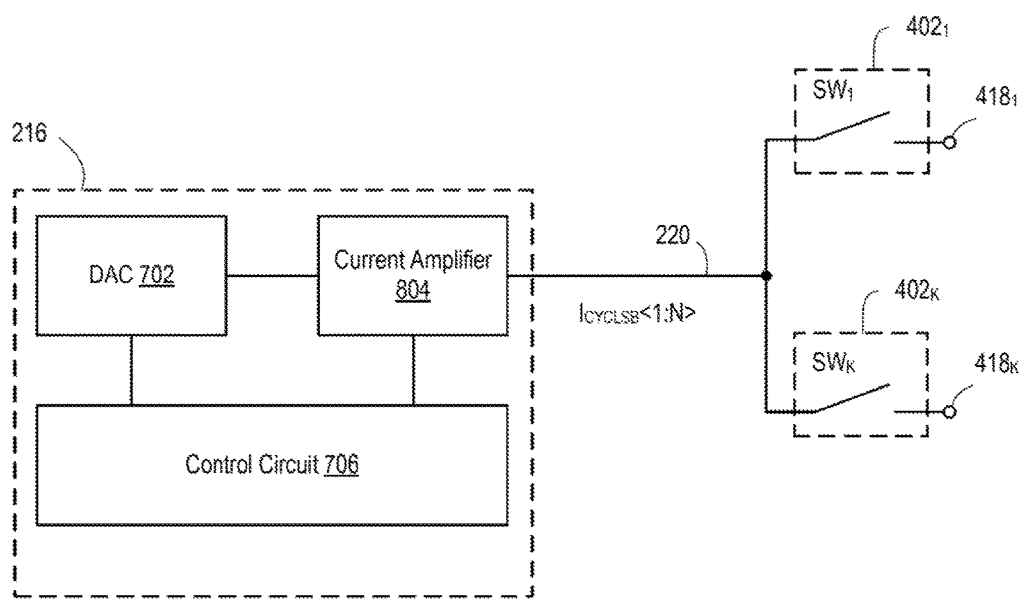
FIG. 8 is a block diagram depicting an alternative structure of a shared reference generator and reference input circuits for an array of SAR ADCs according to an embodiment.

FIG. 8 is a block diagram depicting an alternative structure of the shared cycle LSB generator 216 and the reference input circuit 402 of each SAR ADC $\mathbf{204}_1$ . . . $\mathbf{204}_N$ (referred to as reference input circuits $\mathbf{402}_1$ . . . $\mathbf{402}_N$). In the present embodiment, the DAC 702 of the shared cycle LSB generator 216 is a current DAC that outputs discrete current levels based on a sequence of digital codes output by the control circuit 706. The shared cycle LSB generator 216 includes a current amplifier 804 rather than the voltage amplifier 704. The current output by the DAC 702 is a reference for the current amplifier 804. The current amplifier 804 output a current $I_{CYCLSB}$, which has a different value for different SAR cycles. The control circuit 706 controls the current amplifier 804 to control the magnitude and duration of the current $I_{CYCLSB}$. Each reference input circuit $\mathbf{402}_1$ . . . $\mathbf{402}_N$ includes a switch SW1 . . . $SW_N$, respectively. The SAR logic 410 in a given SAR ADC $\mathbf{204}_i$ closes a switch SW; to add or remove a charge $Q_{LSB}$ to or from the capacitor $C_{SH}$. Adding or removing charge from the capacitor $C_{SH}$ effectively increases or decreases the voltage $V_{IN}$. Otherwise, the SAR ADC $\mathbf{204}_i$ operates as described above.

Figure 10A:
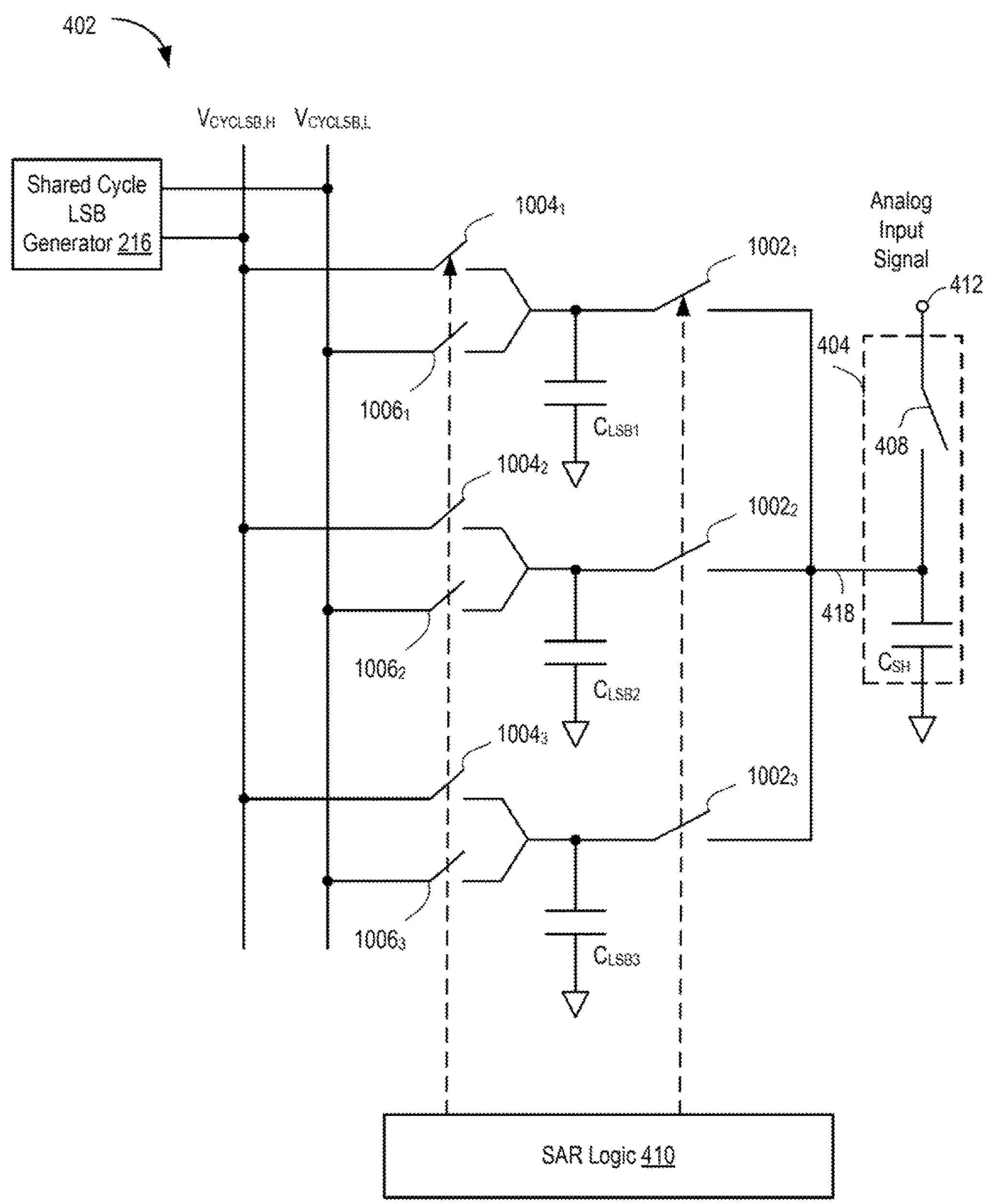
FIGS. 10A-10B are schematic diagrams depicting a reference input circuit in a SAR ADC according to other embodiments.

FIG. 10A is a schematic diagram depicting the reference input circuit 402 according to another embodiment. The reference input circuit 402 includes a switched-capacitor circuit that includes a single-ended voltage output with differential cycle LSB topology. In the embodiment of FIG. 10A, the reference input circuit 402 includes three capacitors $C_{LSB1}$, $C_{LSB2}$, and $C_{LSB3}$, switches $\mathbf{1002}_1$ . . . $\mathbf{1002}_3$, switches $\mathbf{1004}_1$ . . . $\mathbf{1004}_3$, and switches $\mathbf{1006}_1$ . . . $\mathbf{1006}_3$. The switches $\mathbf{1002}_1$ . . . $\mathbf{1002}_3$ couple the top plates of the capacitors $C_{LSB1}$, $C_{LSB2}$, and $C_{LSB3}$ to the node 418. The bottom plates of the capacitors $C_{LSB1}$, $C_{LSB2}$, and $C_{LSB3}$ are coupled to ground. The shared cycle LSB generator 216 provides a voltage $Vcyc_{LSB,H}$ to a first bus and a voltage $Vcyc_{LSB,L}$ to a second bus. The switches $\mathbf{1004}_1$ . . . $\mathbf{1004}_3$ are coupled between the $Vcyc_{LSB,H}$ bus and the top plate of the capacitors $C_{LSB1}$, $C_{LSB2}$, and $C_{LSB3}$. The switches $\mathbf{1006}_1$ . . . $\mathbf{1006}_3$ are coupled between the $Vcyc_{LSB,L}$ bus and the top plate of the capacitors $C_{LSB1}$, $C_{LSB2}$, and $C_{LSB3}$. The SAR logic 410 controls the switches 1002, 1004, and 1006. In the circuit topology shown in FIG. 5, the voltages in the circuit will be bipolar with reference to a ground node. So the circuit in FIG. 5 uses a mid-rail voltage that serves as the ground node. Such a mid-rail voltage can involve the use of a large voltage buffer, which can be undesirable. The topology of the circuit in FIG. 10 removes the need for a mid-rail reference voltage and the associated voltage buffer. The circuit shown in FIG. 10A uses a third reference capacitor, but the third reference capacitor can be smaller than the addition of a mid-rail voltage reference buffer and the power consumption associated with the third reference capacitor is likely less than such a mid-rail voltage buffer.

Figure 10B:
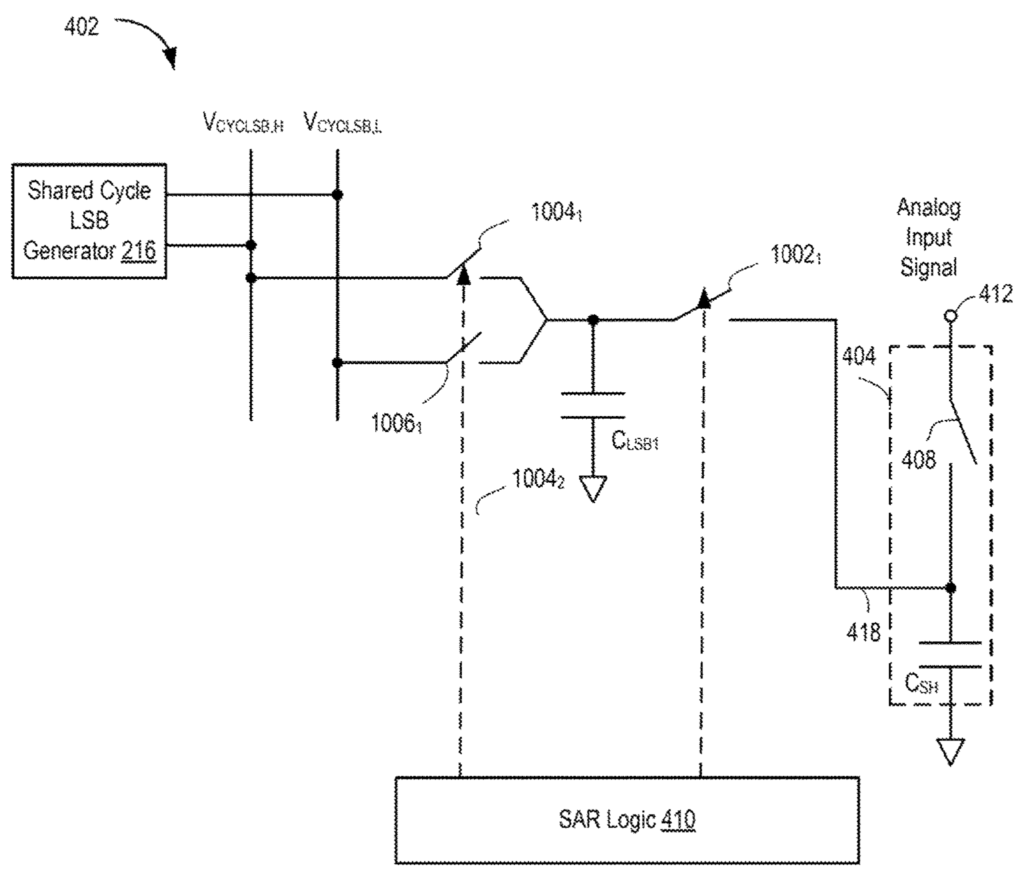

FIG. 10B is a schematic diagram depicting the reference input circuit 402 according to another embodiment. The reference input circuit 402 includes a switched-capacitor circuit. In the embodiment of FIG. 10B, the reference input circuit 402 includes only one capacitor $C_{LSB1}$ and the switches $\mathbf{1002}_1$, $\mathbf{1004}_1$ and $\mathbf{1006}_1$. The LSB capacitors $C_{LSB2}$ and $C_{LSB3}$, and the switches $\mathbf{1002}_2$, $\mathbf{1002}_3$, $\mathbf{1004}_2$, $\mathbf{1004}_3$, $\mathbf{1006}_2$ and $\mathbf{1006}_3$ are omitted. In this embodiment, the LSB capacitor charging and the comparison operations are done in sequence, rather than in parallel as described above in FIG. 10A. The embodiment in FIG. 10B is similar to the embodiment in FIG. 6, but with an important difference: in the embodiment in FIG. 10B, the shared cycle LSB generator has a pair of differential outputs $V_{CYCLSB,H}$ and $V_{CYCLSB,L}$, and $C_{LSB1}$ can be charged to either $V_{CYCLSB,H}$ or $V_{CYCLSB,L}$. This allows the bottom plates of $C_{LSB1}$ and $C_{SH}$ to be connected to the ground. As in the case of the embodiment in FIG. 6, the embodiment of FIG. 10B requires less implementation area than the embodiment of FIG. 10A and can be used where the silicon area is required to be minimized at the cost of decreasing the maximum sampling rate. Otherwise, the reference input circuit 402 operates as described above with respect to FIG. 10A. In an embodiment, the capacitor $C_{LSB1}$ can be a variable capacitor.

Figure 11A:
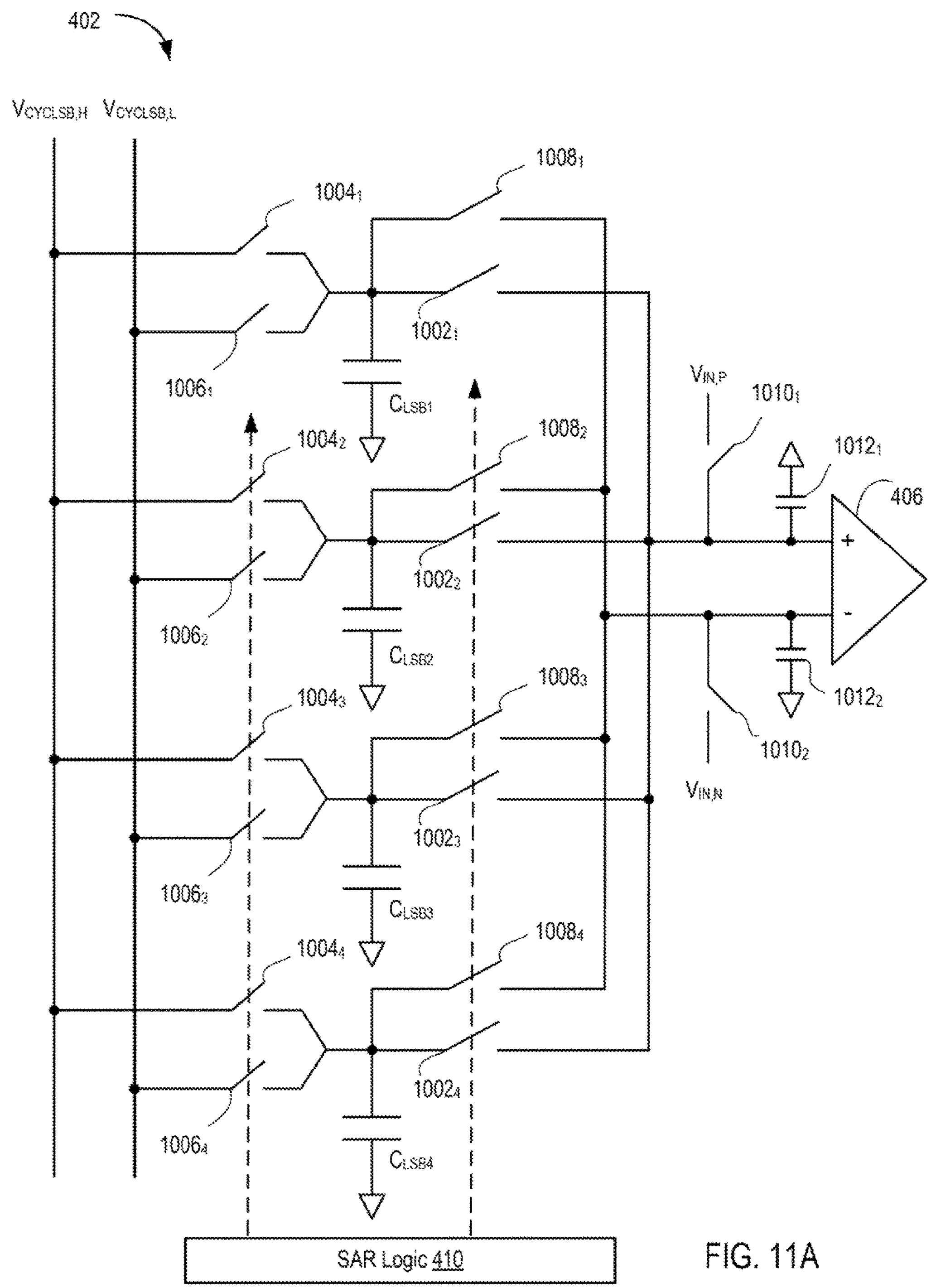
FIGS. 11A-B are schematic diagrams depicting a reference input circuit in a SAR ADC according to other embodiments.

FIG. 11A is a schematic diagram depicting the reference input circuit 402 according to yet another embodiment. The reference input circuit 402 includes a switched-capacitor circuit that includes fully differential topology. In the embodiment of FIG. 11A, the top plates of the capacitors $C_{LSB1}$, $C_{LSB2}$, and $C_{LSB3}$ are further coupled to the inverting input of the comparator 406 through the switches $\mathbf{1008}_1$ . . . $\mathbf{1008}_3$. The non-inverting input of the comparator 406 is coupled to a sampling capacitor $\mathbf{1012}_1$ and a positive voltage input. The inverting input of the comparator 406 is coupled to a sampling capacitor $\mathbf{1012}_2$ and a negative voltage input. Although one more reference capacitor is required similar as in the circuit of FIG. 10A, the fully differential version has two times $V_{FS}$ range compared to the singed-ended topology of FIG. 10A. The two times $V_{FS}$ range could allow for use of a significantly more compact and low-power comparator.

Figure 11B:
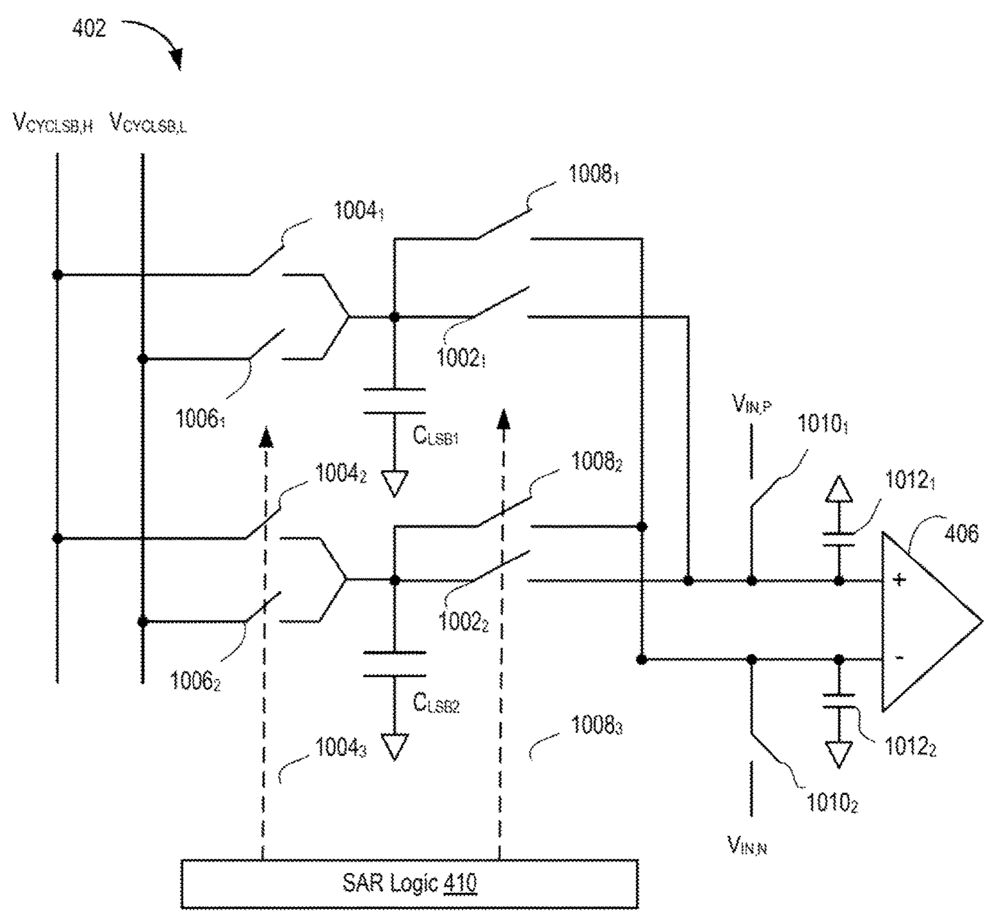

FIG. 11B is a schematic diagram depicting the reference input circuit 402 according to another embodiment. The reference input circuit 402 includes a switched-capacitor circuit. In the embodiment of FIG. 11B, the reference input circuit 402 includes two capacitors $C_{LSB1}$ and $C_{LSB2}$, and the switches 1002$_1$, 1002$_2$, 1004$_1$, 1004$_2$, 1006$_1$, 1006$_2$, 1008$_1$, and 1008$_2$. The LSB capacitors $C_{LSB3}$ and $C_{LSB4}$, and the switches 1002$_3$, 1002$_4$, 1004$_3$, 1004$_4$, 1006$_3$, 1006$_4$, 1008$_3$, and 1008$_4$ are omitted. In this embodiment, the LSB capacitor charging and the comparison operations are done in sequence, rather than in parallel as described above in FIG. 11A. As in the case of the embodiments in FIG. 6 and FIG. 10B, the embodiment of FIG. 11B requires less implementation area than the embodiment of FIG. 10A and can be used where the silicon area is required to be minimized at the cost of decreasing the maximum sampling rate. Otherwise, the reference input circuit 402 operates as described above with respect to FIG. 11A. In an embodiment, the capacitor $C_{LSB1}$ and $C_{LSB2}$ can be a variable capacitors.

The embodiments and examples set forth herein were presented to explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

We claim:

1. An apparatus for converting a plurality of analog signals to a plurality of digital signals, comprising:

a plurality of successive approximation (SAR) analog-to-digital converters (ADCs) each including a first input configured to receive a respective one of the plurality of analog signals, a second input configured to receive a cycle LSB signal, and an output configured to provide a respective one of the plurality of digital signals; and a shared cycle LSB generator coupled to the plurality of SAR ADCs and configured to provide the cycle LSB signal shared by the plurality of SAR ADCs.

2. The apparatus of claim 1, wherein each of the plurality of SAR ADCs comprises:

a first capacitor configured to supply an input signal;

a reference input circuit configured to adjust the input signal in response to the cycle LSB signal and a control signal;

a comparator having a first input coupled to the first capacitor, a second input configured to receive a constant reference voltage, and an output; and SAR logic coupled to the output of the comparator and configured to generate the control signal and a respective one of the plurality of digital signals.

3. The apparatus of claim 1, wherein the shared cycle LSB generator comprises:

a digital-to-analog converter (DAC) having an output; and a voltage amplifier coupled to the output of the DAC and configured to provide the cycle LSB signal.

4. The apparatus of claim 2, wherein the reference input circuit of each of the plurality of SAR ADCs comprises:

a switched capacitor circuit coupled between an output of the shared cycle LSB generator and the first input of the comparator.

5. The apparatus of claim 4, wherein the switched capacitor circuit comprises:

a first capacitor having a top plate and a bottom plate, the top plate thereof coupled to the output of the shared cycle LSB generator, the top and bottom plates thereof switchably coupled to a constant bias voltage and switchably coupled to the first input of the comparator; and a second capacitor having a top plate and a bottom plate, the top plate thereof coupled to the output of the shared cycle LSB generator, the top and bottom plates thereof switchably coupled to the constant bias voltage and switchably coupled to the first input of the comparator.

6. The apparatus of claim 4, wherein the switched capacitor circuit comprises:

only one capacitor having a top plate and a bottom plate, the top plate thereof coupled to the output of the shared cycle LSB generator, the top and bottom plates thereof switchably coupled to a constant bias voltage and switchably coupled to the first input of the comparator.

7. The apparatus of claim 4, wherein the switched capacitor circuit comprises:

first, second, and third capacitors each having a top plate switchably coupled to the first input of the comparator and each having a bottom plate coupled to ground;

wherein the output of the shared cycle LSB generator includes a first output switchably coupled to the top plate of each of the first, second, and third capacitors and a second output switchably coupled to the top plate of each of the first, second, and third capacitors.

8. The apparatus of claim 4, wherein the switched capacitor circuit comprises:

only one capacitor having a top plate switchably coupled to the first input of the comparator and having a bottom plate coupled to ground;

wherein the output of the shared cycle LSB generator includes a first output switchably coupled to the top plate of the capacitor and a second output switchaby coupled to the top plate of the capacitor.

9. The apparatus of claim 4, wherein the reference input circuit of each of the plurality of SAR ADCs comprises:

first, second, third, and fourth capacitors each having a top plate switchably coupled to the first and second inputs of the comparator and each having a bottom plate coupled to ground;

wherein the output of the shared cycle LSB generator includes a first output switchably coupled to the top plate of each of the first, second, third and fourth capacitors and a second output switchably coupled to the top plate of each of the first, second, third, and fourth capacitors.

10. The apparatus of claim 4, wherein the reference input circuit of each of the plurality of SAR ADCs comprises:

first and second capacitors each having a top plate switchably coupled to the first and second inputs of the comparator and each having a bottom plate coupled to ground;

wherein the output of the shared cycle LSB generator includes a first output switchably coupled to the top plate of each of the first and second capacitors and a second output switchably coupled to the top plate of each of the first and second capacitors.

11. An integrated circuit (IC), comprising:

a plurality of analog front ends (AFEs) configured to provide a plurality of analog signals;

a plurality of successive approximation (SAR) analog-to-digital converters (ADCs) each including a first input configured to receive one of the plurality of analog signals, a second input configured to receive a cycle LSB signal, and an output configured to provide a digital signal;

a shared cycle LSB generator coupled to the plurality of SAR ADCs and configured to provide the cycle LSB signal shared by the plurality of SAR ADCs; and a processing system configured to process the digital signal output from each of the plurality of SAR ADCs.

12. The IC of claim 11, wherein each of the plurality of SAR ADCs comprises:

a first capacitor configured to supply an input signal;

a reference input circuit configured to adjust the input signal in response to the cycle LSB signal and a control signal;

a comparator having a first input coupled to the first capacitor, a second input configured to receive a constant reference voltage, and an output; and SAR logic coupled to the output of the comparator and configured to generate the control signal and the digital signal output from the respective SAR ADC.

13. The IC of claim 11, wherein the shared cycle LSB generator comprises:

a digital-to-analog converter (DAC) having an output; and a voltage amplifier coupled to the output of the DAC and configured to provide the cycle LSB signal as voltages shared by the plurality of SAR ADCs.

14. The IC of claim 12, wherein the reference input circuit of each of the plurality of SAR ADCs comprises:

a switched capacitor circuit coupled between an output of the shared cycle LSB generator and the first input of the comparator.

15. The IC of claim 11, wherein the shared cycle LSB generator comprises:

a digital-to-analog converter (DAC) having an output; and a current amplifier coupled to the output of the DAC and configured to provide the cycle LSB signal as currents shared by the plurality of SAR ADCs.

16. The IC of claim 11, wherein the shared cycle LSB generator comprises:

a digital-to-analog converter (DAC) having an output;

an electrical charge generating circuit coupled to the output of the DAC and configured to provide the cycle LSB signal as electrical charges shared by the plurality of SAR ADCs.

17. The IC of claim 12, wherein the cycle LSB signal has a sequence of discrete values over a plurality of SAR cycles, and wherein, for each of the plurality of SAR ADCs, the comparator is configured to perform a sequence of comparisons between the input signal and the constant reference voltage over the plurality of SAR cycles, the SAR logic is configured to generate a digital value based on the sequence of comparisons, and the reference input circuit is configured to successively adjust the input signal in response to the sequence of discrete values of the cycle LSB signal.

18. A method of converting a plurality of analog signals to a plurality of digital signals, the method comprising:

providing the plurality of analog signals to a plurality of successive approximation (SAR) analog-to-digital converters (ADCs) each including a first input configured to receive a respective one of the plurality of analog signals, a second input that configured to receive a cycle LSB signal, and an output configured to provide a respective one of the plurality of digital signals; and generating the cycle LSB signal using a cycle LSB reference generator shared by the plurality of SAR ADCs.

19. The method of claim 18, further comprising, for each of the plurality of SAR ADCs:

sampling a respective one of the plurality of analog signals to generate an input signal;

successively comparing the input signal with a constant reference voltage to generate a comparison result, and updating the input signal based on the comparison result and a value of the cycle LSB signal, for a plurality of SAR cycles; and generating a digital code based on the comparison result of each of the plurality of SAR cycles.

20. The method of claim 18, further comprising, for each of the plurality of SAR ADCs:

sampling a respective one of the plurality of analog signals to generate a first input signal;

successively comparing the first input signal with a second input signal to generate a comparison result, and updating the second input signal based on the comparison result and a value of the reference signal, for a plurality of SAR cycles; and generating a digital code based on the comparison result of each of the plurality of SAR cycles.

21. The method of claim 18, wherein the shared cycle LSB generator comprises a voltage source and the cycle LSB signal comprises a voltage signal or a current signal.

22. The method of claim 18, wherein the cycle LSB signal has a sequence of discrete values over a plurality of SAR cycles.

23. A method of converting a plurality of analog signals to a plurality of digital signals, the method comprising:

providing the plurality of analog signals to a plurality of successive approximation (SAR) analog-to-digital converters (ADCs) each including a first capacitor that receives a respective one of the plurality of analog signals, a reference input circuit that receives a cycle LSB signal and is coupled to the first capacitor, and a comparator that is coupled to the first capacitor and provides a respective one of the plurality of digital signals; and each of the SAR ADCs controlling a voltage at the first capacitor to be $\alpha[k](V[k-1]-D[k-1]\cdot LSB[k])$, where $D[k]$ is a voltage output from the comparator in a kth cycle, $LSB[k]$ is a voltage of the cycle LSB signal in the kth cycle, $\alpha[k]$ is a scale factor for the kth cycle, $D[k-1]$ is the voltage output from the comparator in a k−1th cycle, and $V[k-1]$ is the voltage at the first capacitor at the k−1th cycle.

24. The method of claim 23, wherein $\alpha[k]$ has a sequence of discrete values over a plurality of SAR cycles, where $\alpha[k]$ can assume values other than one and wherein $\alpha[k]$ can vary from cycle to cycle.

* * * * *